(12) United States Patent
Gao

(10) Patent No.: US 10,103,741 B2
(45) Date of Patent: Oct. 16, 2018

(54) METHOD FOR CONTROLLING DIGITAL FRACTIONAL FREQUENCY-DIVISION PHASE-LOCKED LOOP AND PHASE-LOCKED LOOP

(71) Applicant: Huawei Technologies Co., Ltd., Shenzhen (CN)

(72) Inventor: Peng Gao, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/625,449

(22) Filed: Jun. 16, 2017

(65) Prior Publication Data
US 2017/0288686 A1 Oct. 5, 2017

Related U.S. Application Data

(63) Continuation of application No. PCT/CN2015/095566, filed on Nov. 25, 2015.

(30) Foreign Application Priority Data

Dec. 18, 2014 (CN) .......................... 2014 1 0802184

(51) Int. Cl.
*H03L 7/197* (2006.01)
*H03L 7/081* (2006.01)
(Continued)

(52) U.S. Cl.
CPC ............ *H03L 7/1974* (2013.01); *H03L 7/081* (2013.01); *H03L 7/085* (2013.01); *H03L 7/091* (2013.01);
(Continued)

(58) Field of Classification Search
CPC ......... H03L 7/081; H03L 7/085; H03L 7/091; H03L 7/0992; H03L 7/197–7/1976
See application file for complete search history.

(56) References Cited

U.S. PATENT DOCUMENTS

| 7,274,231 B1 | 9/2007 | Gillespie et al. |
| 7,907,016 B2 * | 3/2011 | Eikenbroek .......... H03L 7/1976 327/156 |

(Continued)

FOREIGN PATENT DOCUMENTS

| CN | 1768479 A | 5/2006 |
| CN | 104052474 A | 9/2014 |

(Continued)

OTHER PUBLICATIONS

Chun-Ming Hsu et al., "A Low-Noise Wide-BW 3.6-GHz Digital ΔΣ Fractional-N Frequency Synthesizer With a Noise-Shaping Time-to-Digital Converter and Quantization Noise Cancellation", IEEE Journal of Solid-State Circuits, vol. 43, No. 12, Dec. 2008, p. 2776-2786.

(Continued)

*Primary Examiner* — Patrick O'Neill

(57) ABSTRACT

A method for controlling a digital fractional frequency-division phase-locked loop and a phase-locked loop are disclosed. The phase-locked loop includes a control apparatus, a TDC, a DLF, a DCO, a DIV, and an SDM. The control apparatus performs delay processing on an active edge of a reference clock according to a frequency control word and a frequency division control word to obtain a delayed reference clock; and sends the delayed reference clock to the TDC so that the TDC performs phase discrimination processing on the delayed reference clock and a feedback clock. A control apparatus added to a phase-locked loop may perform delay processing on a reference clock according to a current frequency control word and a current frequency division control word, so that a feedback clock and a delayed reference clock have active edges that approximately correspond in time.

15 Claims, 6 Drawing Sheets

(51) Int. Cl.
*H03L 7/085* (2006.01)
*H03L 7/091* (2006.01)
*H03L 7/099* (2006.01)

(52) U.S. Cl.
CPC .......... *H03L 7/0992* (2013.01); *H03L 7/1976* (2013.01)

(56) References Cited

U.S. PATENT DOCUMENTS

| | | | |
|---|---|---|---|
| 7,999,623 B2 * | 8/2011 | Lin | H03L 7/1976 327/156 |
| 8,791,733 B2 * | 7/2014 | Tertinek | H03L 7/1976 327/156 |
| 8,866,519 B1 | 10/2014 | Hiebert | |
| 9,356,612 B2 * | 5/2016 | Gao | H03L 7/091 |
| 9,537,585 B2 * | 1/2017 | Mayer | H04B 17/21 |
| 9,740,175 B2 * | 8/2017 | Burg | H03L 7/091 |
| 2009/0256601 A1 | 10/2009 | Zhang et al. | |
| 2011/0140790 A1 | 6/2011 | Wu et al. | |
| 2017/0346493 A1 * | 11/2017 | Markulic | H03K 5/159 |

FOREIGN PATENT DOCUMENTS

| | | |
|---|---|---|
| CN | 104506190 A | 4/2015 |
| EP | 2782255 A1 | 9/2014 |

OTHER PUBLICATIONS

Mike Shuo-Wei Chen: "Overhead minimization techniques for digital phase-locked loop frequency synthesizer", Aug. 5, 2012, XP032231460, 4 pages.

* cited by examiner

METHOD FOR CONTROLLING DIGITAL FRACTIONAL FREQUENCY-DIVISION PHASE-LOCKED LOOP AND PHASE-LOCKED LOOP

CROSS-REFERENCE TO RELATED APPLICATIONS

This application is a continuation of International Application No. PCT/CN2015/095566, filed on Nov. 25, 2015, which claims priority to Chinese Patent Application No. 201410802184.3, filed on Dec. 18, 2014. The disclosures of the aforementioned applications are hereby incorporated by reference in their entireties.

TECHNICAL FIELD

The present invention pertains to the field of electronic technologies, and in particular, relates to a method for controlling a digital fractional frequency-division phase-locked loop and a phase-locked loop.

BACKGROUND

In radio frequency transceivers, a frequency synthesizer based on a phase-locked loop (PLL) structure is widely adopted to generate a local oscillation signal, referred to as a local-frequency signal for short, so as to complete frequency shifting of a data signal.

In a wireless communications system, particularly in a wireless terminal, a zero intermediate-frequency (ZIF) radio frequency transceiver architecture is widely adopted in consideration of costs and other factors. In such a radio frequency transceiver architecture, both a signal transmit channel and a signal receive channel require that a frequency of the local-frequency signal be exactly the same as a frequency of a radio frequency carrier signal. In other words, as a local-frequency signal generating apparatus, a frequency synthesizer based on a phase-locked loop has a high enough output frequency precision. For example, for a cellular radio communications system, a frequency step of a radio frequency is 100 kHz. This requires that a phase-locked loop frequency synthesizer applied to such a system be capable of outputting a local-frequency signal at an precision of 100 kHz.

In a wireless communications system, for a phase-locked loop module serving as a frequency synthesizer, a multiplication relationship expressed by the following formula needs to hold between an output radio frequency $f_{RF}$ and an input reference clock frequency $f_{REF}$:

$$f_{RF} = FCW \times f_{REF}$$

In the foregoing formula, FCW (Frequency Control Word) is a frequency control word of the phase-locked loop. By FCW value type, that is, a relative relationship between the output radio frequency and the input reference clock frequency, phase-locked loops may be categorized into two types as follows:

(1) Integral frequency-division phase-locked loop. In this type of phase-locked loop, the FCW is a positive integer, which means that the output radio frequency is an integer multiple of the input reference clock frequency. For the foregoing frequency synthesizer requiring a frequency precision of 100 kHz, the input reference clock frequency is required to be $f_{REF}$=100 kHz.

(2) Fractional frequency-division phase-locked loop. In this type of phase-locked loop, the FCW may have a fractional part. Therefore, an output radio frequency precision of the phase-locked loop may be less than the reference clock frequency. That is, a frequency selection for a reference clock is no longer restricted by the radio frequency precision. Because of advantages in such aspects as locking time, integral phase noise, and design flexibility, the fractional frequency-division phase-locked loop is more widely applied in modern wireless communications systems than the integral frequency-division phase-locked loop.

Additionally, a digital phase-locked loop architecture appearing in recent years transfers phase signal processing of the phase-locked loop to a digital domain, and outputs a high-precision oscillator control signal by using a digital over-sampling technology. In this way, digital design of the phase-locked loop is well implemented. The digital phase-locked loop architecture replaces a traditional phase-locked loop of an analog structure with significant advantages, and has been widely used.

A digital fractional frequency-division phase-locked loop structure widely used at present, shown in FIG. 1, includes the following few basic composition elements:

(1) a time-to-digital converter (TDC), configured to identify a time difference between a reference clock CLK_REF and a feedback clock signal CLK_DIV, and converts this time difference to a digital signal TDC_OUT;

(2) a digital loop filter (DLF), configured to filter a TDC_OUT signal, and output a digital oscillator frequency control signal DLF_OUT;

(3) a digital controlled oscillator (DCO), configured to generate an oscillation signal F_DCO, which is a digital signal;

(4) a feedback frequency divider (DIV), configured to output a frequency division value under control of a Sigma-Delta modulator, perform frequency division processing on the F_DCO by using this frequency division value, and input the signal CLK_DIV that has undergone the frequency division processing to the TDC so as to perform phase discrimination processing on the CLK_REF and the CLK_DIV; and (5) the sigma-Delta modulator (SDM), configured to implement a fractional frequency division operation. A basic principle of this operation is to use the SDM to regularly control a frequency division ratio of the DIV so that a feedback frequency division ratio of the phase-locked loop regularly switches between two or more positive integer values, and finally obtains an average frequency division ratio as a required fractional frequency division value. For example, the frequency control word specified by the fractional frequency-division phase-locked loop is:

$$FCW = \frac{f_{DCO}}{f_{REF}} = N.F$$

In the foregoing formula, $f_{DCO}$ and $f_{REF}$ are a frequency of an oscillator output signal and a frequency of the reference clock respectively. A form of N.F is used in the foregoing formula to denote a fractional frequency division ratio, where N is an integer part of the frequency division ratio, and F is a fractional part of the frequency division ratio. By sending the frequency control word FCW into the SDM, a series of integral frequency division values in the vicinity of N can be obtained from an SDM output, that is:

$$N_{DIV} \in \{\ldots, N-2, N-1, N, N+1, N+2, \ldots\}$$

In the foregoing formula, $N_{DIV}$ is a frequency division control word output by the SDM for the feedback frequency divider, and N is an integer part of the frequency control word FCW) of the phase-locked loop. A specific value range of the NDIV depends on a design type of the SDM.

In the foregoing existing digital fractional frequency-division phase-locked loop, subject to control by the SDM, the frequency division ratio of the frequency divider DIV regularly changes among multiple integer values. Therefore, in a locked state of the phase-locked loop, the output CLK_DIV of the DIV is not a signal of a steady frequency. As shown in FIG. 2, it is assumed that an output frequency of the digital controlled oscillator DCO in the phase-locked loop is $f_{DCO}$. Then its cycle is $T_{DCO}=1/f_{DCO}$. It is assumed that at the $k^{th}$ sampling point, the frequency division ratio of the DIV is $N_{DIV}[k]$, and at this point, an instantaneous cycle of the feedback clock CLK_DIV is:

$$T_{DIV}[k]=T_{DCO} \times N_{DIV}[k]$$

It can be learned from the foregoing formula that because, in the locked state of the fractional frequency-division phased-locked loop, the NDIV value changes regularly subject to control by the SDM, the cycle of the feedback clock CLK_DIV changes accordingly. Corresponding to that, the cycle $T_{REF}$ of the reference clock CLK_REF is steady and unchanged. Therefore, as shown in FIG. 2, in a fractional frequency-division locked state, there is always a relatively large time domain deviation that changes in accordance with a particular rule between the reference clock CLK_REF and the feedback clock CLK_DIV. In FIG. 2, a time domain deviation at the $k^{th}$ sampling point is denoted by $\Delta T_{TDC}[k]$. In other words, in the existing digital fractional phase-locked loop, the TDC used to discriminate the time deviation between the CLK_REF and the CLK_DIV needs to be capable of precisely processing a given range of time domain inputs.

Another important constraint to design of the TDC is its resolution. In the digital phase-locked loop, a function of the TDC is to identify the time difference (or a phase difference) between the reference clock CLK_REF and the feedback clock CLK_DIV, and to convert the time difference into a digital signal at a particular resolution. Such operation may be described as:

$$D_{TDC}[k] = \text{INT}\left(\frac{\Delta T[k]}{R_{TDC}}\right)$$

In the foregoing formula, $R_{TDC}$ is a resolution of the TDC; the INT( ) function competes a rounding operation. As a special type of analog-to-digital converter, the resolution $R_{TDC}$ determines a level of quantization noise output by the TDC, and also determines an in-band phase noise level in the digital phase-locked loop. For a digital phase-locked loop applied to a cellular mobile communications system, a calculated TDC resolution is generally required to be $R_{TDC}<10$ ps. For systems that have more stringent requirements on in-band phase noise, such as a wireless LAN, a higher requirement on the TDC resolution is imposed.

To sum up, two important factors need to be taken into consideration in design of the TDC: the input time domain range and the resolution. However, there is usually a tight trade-off between a range and an precision, and it is often difficult to meet the two dimensions at the same time. Due to a limitation of the structure of the TDC itself, a great challenge has been posed to the design of the TDC to meet the foregoing requirements. Therefore, how to reduce design difficulty of the TDC using a simple and effective means to ensure good convenience in design of a digital fractional frequency-division phase-locked loop system is an urgent issue to be resolved.

SUMMARY

In view of the foregoing problem, embodiments of the present invention provide a method for controlling a digital fractional frequency-division phase-locked loop and a phase-locked loop, to reduce a time domain range input to a TDC using a simple and effective means, thereby ensuring convenience, ease and efficiency in design of a digital fractional frequency-division phase-locked loop system while reducing design difficulty of the TDC.

In a first aspect, an embodiment of the present invention provides a digital fractional frequency-division phase-locked loop, including:

a control apparatus, a time-to-digital converter TDC, a digital loop filter DLF, a digital controlled oscillator DCO, a feedback frequency divider DIV, and a Sigma-Delta modulator SDM, where an output end of the control apparatus is connected to a first input end of the TDC; an output end of the TDC is connected to an input end of the DLF; an output end of the DLF is connected to an input end of the DCO; an output end of the DCO is connected to a first input end of the DIV; an output end of the DIV is connected to a second input end of the TDC, a second input end of the DIV is connected to an output end of the SDM; a first input end of the control apparatus is connected to the output end of the SDM; a second input end of the control apparatus is connected to an input end of the SDM; and a third input end of the control apparatus receives a reference clock of the phase-locked loop;

the SDM is configured to obtain a frequency division control word according to a frequency control word input to the SDM;

the DIV is configured to perform frequency division processing on an output signal of the DCO according to the frequency division control word to obtain a feedback clock;

the control apparatus is configured to perform delay processing on an active edge of the reference clock according to the frequency control word and the frequency division control word to obtain a delayed reference clock;

the TDC is configured to perform phase discrimination processing on the feedback clock and the delayed reference clock to obtain a time difference between the delayed reference clock and the feedback clock;

the DLF is configured to perform filtering processing on the time difference that is output after the TDC performs the phase discrimination processing to obtain a processing result; and the DCO is configured to obtain the output signal according to the processing result.

In a first possible implementation manner of the first aspect, the control apparatus includes: a controller and a digital-to-time converter DTC, where a first input end of the controller is connected to the first input end of the control apparatus, and a second input end of the controller is connected to the second input end of the control apparatus;

a first output end of the controller is connected to a first input end of the DTC;

a second input end of the DTC is connected to a third input end of the control apparatus;

an output end of the DTC is connected to the output end of the control apparatus;

the controller is configured to receive the frequency control word and the frequency division control word, and determine a value of a delay control signal according to the frequency control word and the frequency division control word; and the DTC is configured to perform the delay processing on the active edge of the reference clock according to the value of the delay control signal to obtain the delayed reference clock.

With reference to the first possible implementation manner of the first aspect, in a second possible implementation manner of the first aspect, the controller is a digital logic circuit.

With reference to the first or second possible implementation manner of the first aspect, in a third possible implementation manner of the first aspect, the controller is specifically configured to determine a value $D_{DTC}[k]$ of the delay control signal, according to the following formula:

$$D_{DTC}[k] = \sum_{i=1}^{k} (N_{DIV}[i] - N.F)$$

where $D_{DTC}[k]$ is a value of the delay control signal at the $k^{th}$ sampling point, $N_{DIV}[i]$ is an instantaneous value of the frequency division control word output by the SDM at the $i^{th}$ sampling point, and N.F is a value of the frequency control word, where N is an integer part of the frequency control word, and .F denotes a fractional part of the frequency control word.

With reference to the first, second, or third possible implementation manner of the first aspect, in a fourth possible implementation manner of the first aspect, a third input end of the controller is connected to the output end of the TDC and the second input end of the controller is connected to the second input end of the DTC; and the controller is further configured to determine a value of a gain control signal according to the frequency control word, the frequency division control word, and the time difference that is output by the TDC, where the gain control signal is used to control an adjustment gain of the delay control signal.

With reference to the fourth possible implementation manner of the first aspect, in a fifth possible implementation manner of the first aspect, the controller is specifically configured to, by using a preset adaptive correction algorithm, determine a value $G_{DTC}[k]$ of the gain control signal, according to the following formula:

$$G_{DTC}[k] = K_{LMS} \times \sum_{i=1}^{k} \{D_{DTC}[i] \times \text{sgn}(D_{TDC}[i])\}$$

where $G_{DTC}[k]$ is a value of the gain control signal at the $k^{th}$ sampling point, $K_{LMS}$ is a gain of the adaptive correction algorithm, $D_{TDC}[i]$ is a time difference that is output by the TDC at the $i^{th}$ sampling point, and sgn( ) is a sign function.

With reference to the fourth or fifth possible implementation manner of the first aspect, in a sixth possible implementation manner of the first aspect, a delay of the delayed reference clock relative to the reference clock is $\Delta T_{DTC}$ [k]=$D_{DTC}[k] \times K_{DTC}[k]$, where $K_{DTC}[k]$ is an adjustment gain of the delay control signal at the $k^{th}$ sampling point.

With reference to the sixth possible implementation manner of the first aspect, in a seventh possible implementation manner of the first aspect, the DTC is specifically configured to obtain the adjustment gain according to the following formula: $K_{DTC}[k]=K0_{DTC}+G_{DTC}[k] \times R_{DTC\_GAIN}$, where $K0_{DTC}$ is a corresponding adjustment gain of the delay control signal when the value of the gain control signal, $G_{DTC}[k]$, is 0; and $R_{DTC\_GAIN}$ is a control coefficient of the gain control signal to the adjustment gain $K_{DTC}[k]$.

In a second aspect, an embodiment of the present invention provides a method for controlling a digital fractional frequency-division phase-locked loop, including:

receiving a frequency control word and a frequency division control word of the phase-locked loop, where the frequency division control word is obtained by a Sigma-Delta modulator SDM in the phase-locked loop according to the frequency control word input to the SDM;

performing delay processing on an active edge of a reference clock according to the frequency control word and the frequency division control word to obtain a delayed reference clock; and sending the delayed reference clock to a time-to-digital converter in the phase-locked loop, so that the TDC performs phase discrimination processing on the delayed reference clock and a feedback clock to obtain a time difference between the delayed reference clock and the feedback clock;

where the feedback clock is obtained by a feedback frequency divider DIV in the phase-locked loop according to the frequency division control word received from the SDM by performing frequency division processing on a DCO output signal received from a digital controlled oscillator DCO, the DCO output signal is obtained by the DCO according to a filtering processing result, and the filtering processing result is obtained by a digital loop filter DLF by performing filtering processing on the time difference that is output after the TDC performs the phase discrimination processing.

In a first possible implementation manner of the second aspect, the performing delay processing on an active edge of a reference clock according to the frequency control word and the frequency division control word to obtain a delayed reference clock, includes:

determining a value of a delay control signal according to the frequency control word and the frequency division control word; and performing the delay processing on the active edge of the reference clock according to the value of the delay control signal to obtain the delayed reference clock.

With reference to the first possible implementation manner of the second aspect, in a second possible implementation manner of the second aspect, the determining a value of a delay control signal according to the frequency control word and the frequency division control word, includes:

determining a value $D_{DTC}[k]$ of the delay control signal, according to the following formula:

$$D_{DTC}[k] = \sum_{i=1}^{k} (N_{DIV}[i] - N.F)$$

where $D_{DTC}[k]$ is a value of the delay control signal at the $k^{th}$ sampling point, $N_{DIV}[i]$ is an instantaneous value of the frequency division control word output by the SDM at the $i^{th}$ sampling point, and N.F is a value of the frequency control word, where N is an integer part of the frequency control word, and .F denotes a fractional part of the frequency control word.

With reference to the second aspect, or the first or second possible implementation manner of the second aspect, in a third possible implementation manner of the second aspect, the method further includes:

determining a value of a gain control signal according to the frequency control word, the frequency division control word, and the time difference that is output by the TDC, where the gain control signal is used to control an adjustment gain of the delay control signal.

With reference to the third possible implementation manner of the second aspect, in a fourth possible implementation manner of the second aspect, the determining a value of a gain control signal according to the frequency control word, the frequency division control word, and the time difference that is output by the TDC, includes:

determining, by using a preset adaptive correction algorithm, a value $G_{DTC}[k]$ of the gain control signal, according to the following formula:

$$G_{DTC}[k] = K_{LMS} \times \sum_{i=1}^{k} \{D_{DTC}[i] \times \text{sgn}(D_{TDC}[i])\}$$

where $G_{DTC}[k]$ is a value of the gain control signal at the $k^{th}$ sampling point, $K_{LMS}$ is a gain of the adaptive correction algorithm, $D_{TDC}[i]$ is a time difference that is output by the TDC at the $i^{th}$ sampling point, and sgn( ) is a sign function.

With reference to the third or fourth possible implementation manner of the second aspect, in a fifth possible implementation manner of the second aspect, a delay of the delayed reference clock relative to the reference clock is $\Delta T_{DTC}[k]=D_{DTC}[k] \times K_{DTC}[k]$, where $K_{DTC}[k]$ is an adjustment gain of the delay control signal at the $k^{th}$ sampling point.

With reference to the fifth possible implementation manner of the second aspect, in a sixth possible implementation manner of the second aspect, the method further includes:

obtaining the adjustment gain according to the following formula: $K_{DTC}[k]=K0_{DTC}+G_{DTC}[k] \times R_{DTC\_GAIN}$, where $K0_{DTC}$ is a corresponding adjustment gain of the delay control signal when the value of the gain control signal, $G_{DTC}[k]$ is 0; and $R_{DTC\_GAIN}$ is a control coefficient of the gain control signal to the adjustment gain $K_{DTC}[k]$.

According to the method for controlling a digital fractional frequency-division phase-locked loop and the phase-locked loop provided in the embodiments of the present invention, a control apparatus is configured in a phase-locked loop to perform delay processing on an active edge of a reference clock. The control apparatus performs the delay processing on the active edge of the reference clock according to a frequency control word and a frequency division control word currently used by the phase-locked loop to obtain a delayed reference clock. Further, the delayed reference clock is sent to a time-to-digital converter TDC in the phase-locked loop so that the TDC performs phase discrimination processing on the delayed reference clock and a feedback clock. The feedback clock is obtained by performing frequency division processing on a DCO output signal according to the frequency control word and the frequency division control word that are currently used by a feedback frequency divider, and the frequency division control word is not a steady value. As a result, the reference clock and the feedback clock have an indefinite time difference. In this solution, a control apparatus is added to a phase-locked loop. The control apparatus may perform delay processing on a reference clock according to a current frequency control word and a current frequency division control word, so that an input signal output to a TDC by a feedback frequency divider, that is, a feedback clock, and a delayed reference clock resulting from delay processing on the feedback clock and the reference clock, have approximate active edges corresponding time. In this way, the TDC only needs to process phase discrimination signals within a relatively small time domain input range. This greatly reduces design difficulty of the TDC and lowers a requirement on a resolution of the TDC, and makes design of the TDC simple and free, thereby ensuring convenience, ease, and efficiency in design of a phase-locked loop.

DETAILED DESCRIPTION

Figure 3:
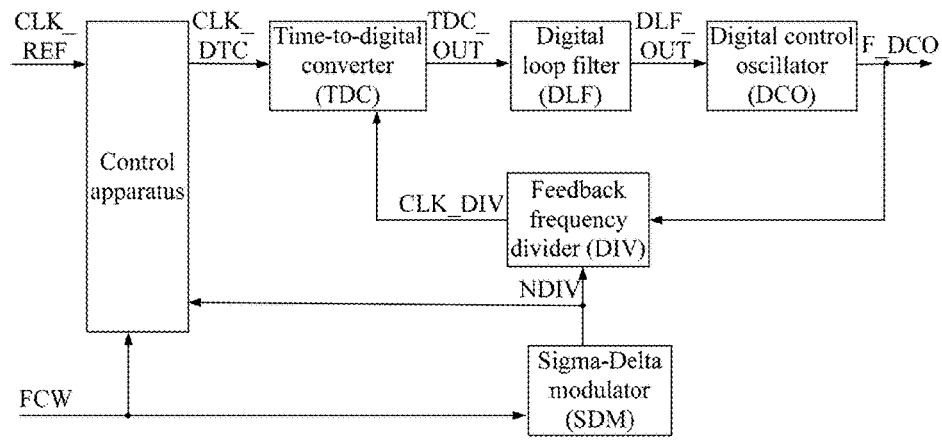
FIG. 3 is a schematic structural diagram of a digital fractional frequency-division phase-locked loop according to Embodiment 1 of the present invention.

FIG. 3 is a schematic structural diagram of a digital fractional frequency-division phase-locked loop according to Embodiment 1 of the present invention. As shown in FIG. 3, the phase-locked loop includes a control apparatus, a time-to-digital converter TDC, a digital loop filter DLF, a digital controlled oscillator DCO, a feedback frequency divider DIV, and a Sigma-Delta modulator SDM.

An output end of the control apparatus is connected to a first input end of the TDC; an output end of the TDC is connected to an input end of the DLF; an output end of the DLF is connected to an input end of the DCO; an output end of the DCO is connected to a first input end of the DIV; an output end of the DIV is connected to a second input end of the TDC; a second input end of the DIV is connected to an output end of the SDM; a first input end of the control apparatus is connected to the output end of the SDM; a second input end of the control apparatus is connected to an input end of the SDM; and a third input end of the control apparatus receives a reference clock of the phase-locked loop.

In the phase-locked loop, components other than the control apparatus have functions similar to those in a prior-art phase-locked loop. Therefore, detailed working principles of these components are not described repeatedly, and their functions are only introduced simply as follows:

the SDM is configured to obtain a frequency division control word NDIV according to a frequency control word FCW input to the SDM;

the DIV is configured to perform frequency division processing on an output signal F_DCO of the DCO according to the frequency division control word NDIV received from the SDM to obtain a feedback clock CLK_DIV;

the control apparatus is configured to perform delay processing on an active edge of the reference clock CLK_REF according to the frequency control word FCW and the frequency division control word NDIV to obtain a delayed reference clock CLK_DTC;

the TDC is configured to perform phase discrimination processing on the feedback clock CLK_DIV and the delayed reference clock CLK_DTC to obtain a time difference between the delayed reference clock CLK_DTC and the feedback clock CLK_DIV;

the DLF is configured to perform filtering processing on the time difference that is output after the TDC performs the phase discrimination processing to obtain a processing result; and the DCO is configured to obtain the output signal F_DCO according to the processing result.

In this embodiment, based on an existing basic digital fractional frequency-division phase-locked loop, a phase-locked loop control apparatus is added. The control apparatus performs delay processing on an active edge of a reference clock CLK_REF according to a frequency control word FCW used by the phase-locked loop and a current frequency division control word NDIV used by a feedback frequency divider DIV, so that a time difference between a delayed reference clock CLK_DTC and a feedback clock CLK_DIV is small as much as possible. In this way, the TDC only needs to process inputs within a relatively small time domain and complexity of TDC design is simplified.

Figure 1:
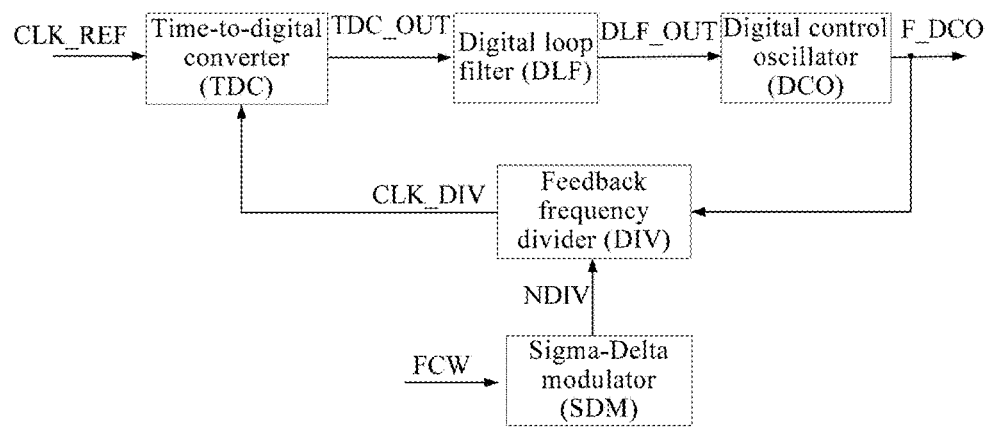
FIG. 1 is a schematic structural diagram of an existing digital fractional frequency-division phase-locked loop.
Figure 2:
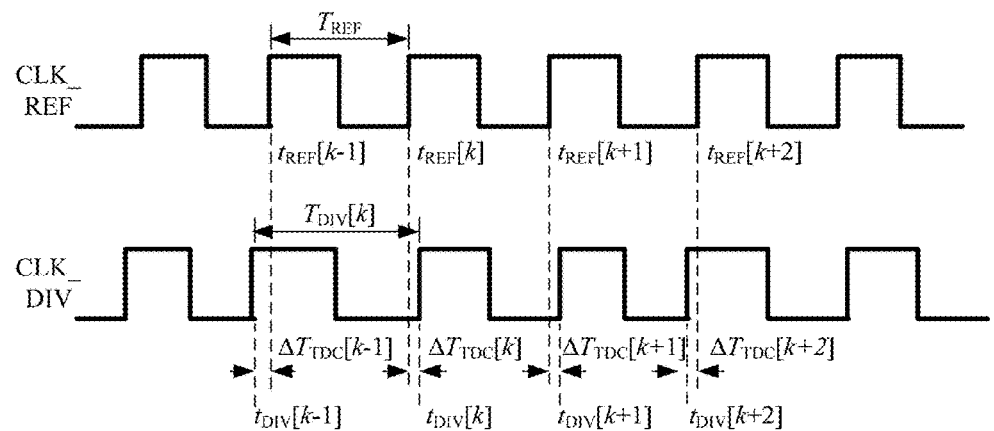
FIG. 2 is a schematic diagram of phase discrimination of the digital fractional frequency-division phase-locked loop shown in FIG. 1.

Specifically, in the existing basic digital fractional frequency-division phase-locked loop, after the frequency control word FCW is sent to the SDM, the SDM outputs a series of integer frequency division values. These integer frequency division values are used as the frequency division control word NDIV of the feedback frequency divider DIV, for performing frequency division processing on the output signal F_DCO of the digital controlled oscillator DCO received by the DIV to obtain the feedback clock CLK_DIV. Then the feedback clock is input as one of inputs to the TDC together with another input, the reference clock CLK_REF, to complete phase discrimination processing, so as to achieve basic functions of the phase-locked loop. However, the NDIV is a series of regular integer values, and the frequency division control word that is input to the DIV changes among these integer values regularly, without being a fixed value. Therefore, a cycle of the feedback clock CLK_DIV changes accordingly. There is always a relatively large time domain deviation that changes in a given rule between the feedback clock and the reference clock CLK_REF that has a fixed cycle. As shown in FIG. 2, the time domain deviation at the $k^{th}$ sampling point is expressed as $\Delta T_{TDC}[k]$. In other words, in the existing digital fractional frequency-division phase-locked loop, the TDC used to discriminate the time deviation between the CLK_REF and the CLK_DIV needs to be capable of precisely processing a wider range of time domain inputs.

In this embodiment, to reduce the time-domain input range that the TDC needs to process so as to ease difficulty and complexity challenges on TDC design, the control apparatus performs particular delay control on the reference clock CLK_REF according to the FCW of the phase-locked loop and the NDIV that is currently input to the DIV, so that the active edge of the delayed reference clock CLK_DTC resulting from the delay processing according to the FCW and the NDIV and the active edge of the CLK_DIV resulting from the frequency division processing on the F_DCO according to the FCW and the NDIV have approximate corresponding time, that is, they have a relatively small time difference or phase difference. In this case, the two input signals CLK_DIV and CLK_DTC that are input to the TDC for phase discrimination processing, have a relatively small time difference. Therefore, the TDC only needs to process the two input signals with a small time difference, or ideally even with a 0 time difference. The complexity of TDC design is greatly reduced.

Figure 4:
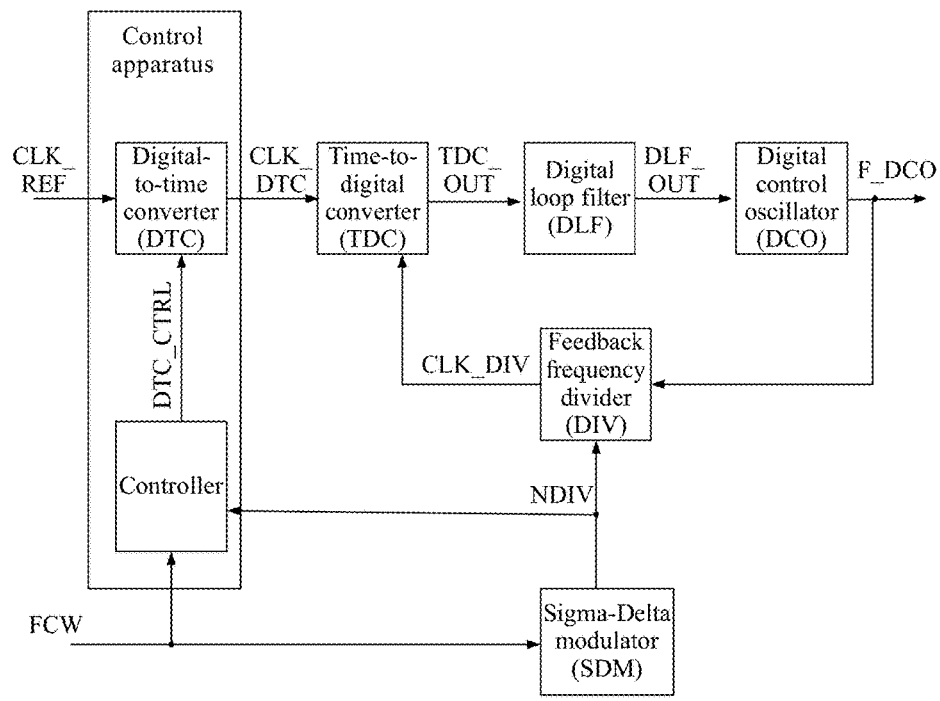
FIG. 4 is a schematic structural diagram of a digital fractional frequency-division phase-locked loop according to Embodiment 2 of the present invention.

In specific implementation, the foregoing control apparatus added to the digital fractional frequency-division phase-locked loop includes a controller and a digital-to-time converter DTC. As shown in FIG. 4, specifically, a first input end of the controller is connected to the first input end of the control apparatus, that is, the output end of the SDM; a second input end of the controller is connected to the second input end of the control apparatus, that is, the input end of the SDM; a first output end of the controller is connected to the first input end of the DTC for transferring a delay control signal DTC_CTRL to the DTC; a second input end of the DTC is connected to the third input end of the control apparatus for receiving the reference clock CLK_REF; and an output end of the DTC is connected to the output end of the control apparatus, that is, the first input end of the TDC.

The controller is configured to: receive the frequency control word used by the phase-locked loop, that is, the frequency control word that is input to the SDM; receive the frequency division control word, that is, the frequency division control word used to perform the frequency division processing on the output signal F_DCO of the DCO and obtained by the SDM according to the frequency control word; determine a value of the delay control signal according to the frequency control word and the frequency division control word; and send the delay control signal to the DTC. The DTC is configured to perform delay processing, according to the value of the delay control signal, on the active edge of the reference clock CLK_REF that is input to the DTC. It is assumed that a rising edge of the clock is the active edge, that is, the phase-locked loop considers the rising edge of the clock as a basis for phase judgment. For a system that considers a falling edge of the clock as the active edge, analogy maybe made accordingly. A delayed output clock signal is the delayed reference clock CLK_DTC.

It should be noted that the value of the delay control signal may desirably characterize using this value to perform delay processing on the active edge of the reference clock CLK_REF, that is, the time difference between the delayed reference clock CLK_DTC and CLK_DIV is approximately 0. Therefore, the TDC only needs to process phase discrimination signals within a very small time domain input range. In addition, the two signals input to the TDC have a relatively small phase difference, which directly makes a requirement on a resolution of the TDC greatly reduced, and further in-band quantization noise caused by the TDC is reduced.

In this embodiment, a control apparatus including a controller and a DTC is added to a digital fractional frequency-division phase-locked loop. After receiving a frequency control word and a frequency division control word of the phase-locked loop, the controller determines a value of a delay control signal according to the frequency control word and the frequency division control word, so that the DTC can perform delay processing on an active edge of a reference clock according to the value of the delay control signal to obtain a delayed reference clock, and transmits the delayed reference clock to a time-to-digital converter TDC in the phase-locked loop, so that the TDC performs phase discrimination processing on the delayed reference clock and a feedback clock. Because the delay processing on the reference clock is performed in accordance with the current frequency control word and the frequency division control word that are used by a feedback frequency divider, an input signal output to the TDC by the feedback frequency divider and the delayed reference clock after the delay processing on the reference clock have a similar phase. In this way, the TDC only needs to process phase discrimination signals within a relatively small time domain input range. This greatly reduces design difficulty of the TDC and lowers a requirement on a resolution of the TDC, and makes design of the TDC simple and free, thereby ensuring convenience, ease, and efficiency in design of a phase-locked loop.

The following describes specific working processes of the controller and the DTC in detail. As described above, the controller needs to determine the value of the delay control signal input to the DTC according to the frequency control word FCW and the frequency division control word NDIV, so that the DTC acts on the reference clock CLK_REF according to the value of the delay control signal. In specific implementation, the controller is configured to determine a value $D_{DTC}[k]$ of the delay control signal, according to the following formula (1):

$$D_{DTC}[k] = \sum_{i=1}^{k} (N_{DIV}[i] - N.F) \qquad (1)$$

where $D_{DTC}[k]$ is a value of the delay control signal at the $k^{th}$ sampling point, $N_{DIV}[i]$ is an instantaneous value of the frequency division control word output by the SDM at the $i^{th}$ sampling point, and N.F is a value of the frequency control word FCW, where N is an integer part of the FCW, and .F denotes a fractional part of the FCW.

That the controller determines the value of the delay control signal according to the formula (1) is obtained based on the following mathematical theory model.

First, before the mathematical theory model is introduced, it should be noted that in the digital fractional frequency-division phase-locked loop, the SDM is employed to control a frequency division ratio, that is, the frequency division control word, of the feedback frequency divider DIV. Since the SDM is employed, the time domain deviation between the reference clock CLK_REF and the feedback clock CLK_DIV, observed from a frequency domain, exhibits a high-pass characteristic in energy. That is, the quantization noise introduced by the SDM is pushed toward the high frequency end in the frequency domain. For the phase-locked loop, in a closed-loop locking condition, the loop itself may have a given low-pass suppression capability on noise introduced by the SDM, and a magnitude of the suppression capability depends mainly on a bandwidth of the DLF. A smaller bandwidth of the DLF bandwidth makes a stronger far-end suppression capability, that is, the quantization noise introduced by the SDM is better suppressed. However, an excessively small bandwidth of the DLF has other impact on characteristics of the phase-locked loop. First, an excessively narrow loop bandwidth affects an establishment time of the phase-locked loop. This is not satisfactory for a system that requires quick locking. Second, since noise contribution of the oscillator DCO in the phase-locked loop is affected by the high-pass characteristic of the loop, an excessively narrow bandwidth leads to an increase in contribution of the oscillator to in-band noise of the phase-locked loop, affecting integral phase noise performance of the loop.

To sum up, the SDM applied in the digital fractional frequency-division phase-locked loop introduces phase noise energy with high-pass distribution in the frequency domain. To suppress this part of noise, an additional constraint is placed on loop bandwidth design of the phase-locked loop. A requirement of this part on the loop bandwidth affects other characteristics of the phase-locked loop, introducing a new trade-off relationship.

Figure 6:
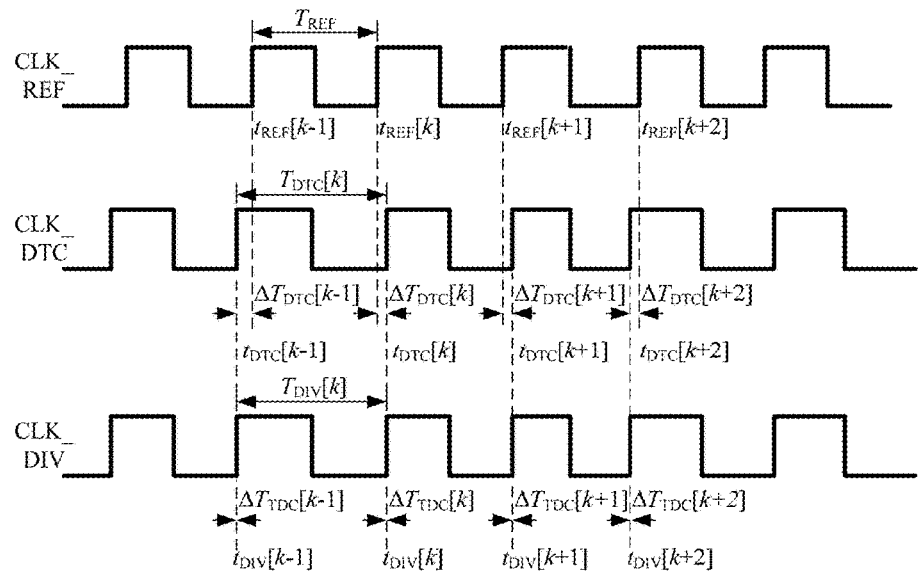
FIG. 6 is a schematic diagram of a timing description of a reference clock, a delayed reference clock and a feedback clock in an embodiment of the present invention.

Provided in this embodiment of the present invention, the digital fractional frequency-division phase-locked loop that incorporates a controller and a DTC can overcome this problem. In this embodiment of the present invention, when the controller and the DTC are introduced to perform delay processing on the active edge of the reference clock, that is, when a specific delay amount is added, the delayed reference clock CLK_DTC resulting from the processing, if aligned with the active edge of the feedback clock signal CLK_DIV, can resolve the design difficulty with an excessively high requirement on the time-domain input range for processing of the DTC. FIG. 6 is a schematic diagram of a timing description of a reference clock, a delayed reference clock and a feedback clock in an embodiment of the present invention. As shown in FIG. 6, in one hand, in the digital fractional frequency-division phase-locked loop to which the DTC is added, what the TDC processes is a time difference between active edges of the two clocks CLK_DTC and CLK_DIV. If the active edges of the two clocks CLK_DTC and CLK_DIV can be aligned before being input to the TDC, a time-domain length that the TDC processes is greatly reduced. As shown in FIG. 6, if the CLK_DTC and the CLK_DIV can be aligned completely as in theory, using any $k^{th}$ sampling cycle as an example, an input time quantity of the TDC may be $\Delta T_{TDC}[k]=0$ in theory. In the other hand, because the active edges of the two clocks CLK_DTC and CLK_DIV are aligned completely, a quantization noise error introduced by the Sigma-Delta modulator SDM may be considered to have been offset at the input of the TDC without affecting a phase noise characteristic of the fractional phase-locked loop system.

Specifically, it can be seen from the foregoing basic idea, a key point of the added phase-locked loop control apparatus is to add a particular delay amount to the active edge of the reference clock CLK_REF by using the DTC, so that the active edges of the delayed reference clock CLK_DTC and the feedback clock CLK_DIV that are output by the DTC are aligned, as shown in FIG. 6. To implement this operation, first, the DTC needs to be made to know a magnitude of a delay amount added at a particular sampling point. That is, as shown in FIG. 6, the DTC knows an accurate value of the delay amount $\Delta T_{DTC}[k]$ at the $k^{th}$ sampling point. According to the basic idea of the present invention, the delay added by the DTC to the active edge of CLK_REF at a particular sampling point is actually the time difference between active edges of the CLK_REF and CLK_DIV at the same sampling time in the existing basic digital fractional frequency-division phase-locked loop. That is, $\Delta T_{DTC}[k]$ in FIG. 6 should be equal to $\Delta T_{TDC}[k]$ in FIG. 2. Therefore, a DTC delay amount parameter required in the structure of the present invention can be deducted based on the basic digital fractional frequency-division phase-locked loop.

The following describes why the controller determines the value of the delay control signal input to the DTC according to the formula (1). This is obtained based on the following mathematical theory model. Specifically, according to the foregoing analysis, to determine the delay amount applied to the reference clock CLK_REF, a time difference between the reference clock CLK_REF and the feedback clock CLK_DIV needs to be first determined.

The time difference between the reference clock CLK_REF and the feedback clock CLK_DIV is determined in the following method.

An absolute time point $t_{REF}[k]$ of the active edge of the reference clock CLK_REF is determined at the $k^{th}$ sampling point according to a formula (2), where k is an integer greater than or equal to 1:

$$t_{REF}[k] = T_{REF} \times k \qquad (2)$$

where $T_{REF}$ is a cycle of the reference clock CLK_REF, and $T_{REF} = T_{DCO} \times N.F$. $T_{DCO}$ is a cycle of the output signal F_DCO of the DCO when the digital fractional frequency-division phase-locked loop is in a locked state. It is assumed that a frequency of F_DCO is $f_{DCO}$, and then $T_{DCO} = 1/f_{DCO}$. Because $FCW = f_{DCO}/f_{REF} = N.F$, $T_{REF} = T_{DCO} \times N.F$.

Because the reference clock CLK_REF is a periodic clock signal of a stable frequency, the absolute time point of the active edge of the CLK_REF at the $k^{th}$ sampling point can be obtained according to the formula (2). Corresponding to that, because the frequency division control word of the feedback divider DIV is affected by the SDM, the cycle of the feedback clock CLK_DIV is not steady. Therefore, an absolute time point $t_{DIV}[k]$ of the active edge of the feedback clock at the $k^{th}$ sampling point can be determined according to a formula (3):

$$t_{DIV}[k] = \sum_{i=1}^{k} T_{DIV}[i] \qquad (3)$$

where $T_{DIV}[k]$ represents an instantaneous cycle of the feedback clock at the $k^{th}$ sampling point. From a working principle of the digital fractional phase-locked loop, it is known that the instantaneous cycle of the CLK_DIV is related to the frequency division control word of the feedback divider DIV at the current point. It is assumed that, at the $k^{th}$ sampling point, the value of the control word NDIV output by the SDM to the DIV is $N_{DIV}[k]$. Then, $T_{DIV}[k] = N_{DIV}[k] \times T_{DCO}$, where $N_{DIV}[k]$ is an instantaneous value of the frequency division control word output by the SDM at the $k^{th}$ sampling point. In a broad sense, the operation of the SDM may be considered as an integer quantization on the fractional frequency control word FCW input to the SDM and shaping the quantization noise to the high frequency end in the frequency domain. Therefore, the instantaneous frequency division control word output by the SDM may be represented as: $N_{DIV}[k] = N.F + N_{QERR}[k]$, where N.F is a value of the frequency division control word FCW; N is an integer part of the frequency control word, and .F denotes a fractional part of the frequency control word; $N_{QERR}[k]$ is a difference value between the instantaneous value of the frequency division control word NDIV at the $k^{th}$ sampling point and the corresponding frequency control word FCW, which is referred to as a quantization error of the frequency division control word.

By substituting the foregoing formulas into the formula (3), the formula (3) may be represented as:

$$t_{DIV}[k] = T_{REF} \times k + T_{DCO} \times \sum_{i=1}^{k} N_{QERR}[i]$$

$$= t_{REF}[k] + T_{DCO} \times \sum_{i=1}^{k} N_{QERR}[i]$$

Therefore, the time difference $\Delta T_{TDC}[k]$ between the reference clock CLK_REF and the feedback clock CLK_DIV is determined in the following formula (4):

$$\Delta T_{TDC}[k] = t_{DIV}[k] - t_{REF}[k] \qquad (4)$$

$$= T_{DCO} \times \sum_{i=1}^{k} N_{QERR}[i]$$

So far the time difference between the reference clock CLK_REF and the feedback clock CLK_DIV has been obtained. The following analyzes the time difference between the reference clock CLK_REF and the delayed reference clock CLK_DTC.

Figure 7:
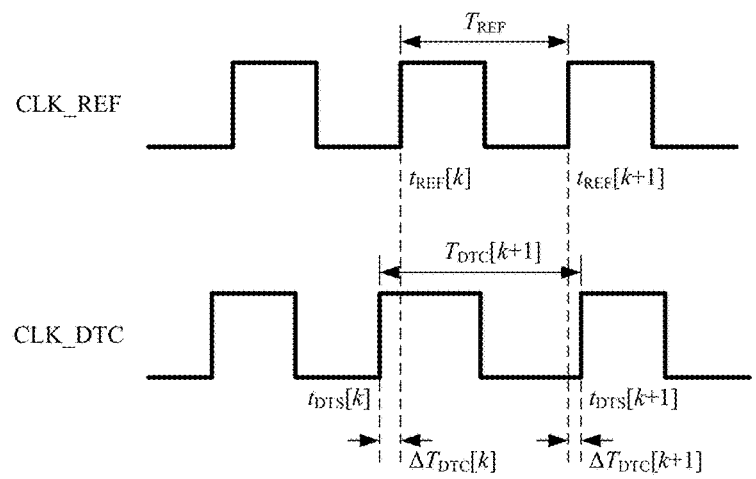
FIG. 7 is a schematic diagram of working of a digital-to-time converter DTC in an embodiment of the present invention.

As described above, the DTC performs the delay processing on the reference clock CLK_REF under action of the control signal of the controller to obtain the delayed reference clock CLK_DTC. FIG. 7 is a schematic diagram of working of a digital-to-time converter DTC in an embodiment of the present invention. As shown in FIG. 7, it is assumed that an absolute time point of the active edge of the reference clock CLK_REF at the $k^{th}$ sampling point is $t_{REF}[k]$. After adjustment by the DTC, the absolute time point of the corresponding active edge of the output delayed reference clock CLK_DTC is $t_{DTC}[k]$. It can be seen from the figure that, at this sampling point, a time-domain delay introduced by the DTC is $\Delta T_{DTC}[k]$, that is, $t_{DTC}[k] = t_{REF}[k] + \Delta T_{DTC}[k]$.

Since the working of the DTC is controlled by the controller, in particular, the control on the DTC by the controller is mainly embodied in two aspects: one is inputting the delay control signal DTC_CTRL to the DTC, and the other is inputting a gain control signal DTC_GAIN to the DTC.

It should be noted that the control on the working of the DTC by the controller may be embodied only in inputting the delay control signal DTC_CTRL to the DTC. Optionally, in order to further implement accurate control, the gain control signal DTC_GAIN may also be input to the DTC on the basis of inputting the delay control signal DTC_CTRL to the DTC.

The delay control signal DTC_CTRL of the DTC is used to control a magnitude of the delay introduced by the DTC. It is assumed that, at the $k^{th}$ sampling point, the value of DTC_CTRL is $D_{DTC}[k]$. Then, at a corresponding point, a time-domain delay introduced by the reference clock CLK_REF, that is, a delay of the delayed reference clock with respect to the reference clock is:

$$\Delta T_{DTC}[k] = D_{DTC}[k] \times K_{DTC}[k] \qquad (5)$$

where $\Delta T_{DTC}[k]$ is the time difference between the reference clock CLK_REF and the delayed reference clock CLK_DTC, and $K_{DTC}[k]$ is an adjustment gain of the delay control signal at the $k^{th}$ point, that is, representing a delay time amount changed by each least significant bit (LSB) of the delay control signal DTC_CTRL. It can be seen from the foregoing formula that the delay introduced by the DTC to the reference clock CLK_REF is controlled in real time by the digital control signal DTC_CTRL.

In addition, the DTC is further controlled by the gain control signal DTC_GAIN for the purpose of controlling the adjustment gain $K_{DTC}[k]$ of the delay control signal DTC_CTRL of the DTC that is described in a formula (5). It is assumed that, at the $k^{th}$ sampling point, a value of the DTC_GAIN is $G_{DTC}[k]$. Then, at this sampling point, the adjustment gain of the DTC delay control signal DTC_CTRL is:

$$K_{DTC}[k] = K0_{DTC} + G_{DTC}[k] \times R_{DTC\_GAIN} \qquad (6)$$

In the foregoing formula, $K0_{DTC}$ is an adjustment gain of the delay control signal DTC_CTRL of the DTC when a value of the gain control signal DTC_GAIN is 0, and $R_{DTC\_GAIN}$ is a control coefficient of the adjustment gain $K_{DTC}[k]$ of the gain control signal DTC_GIN to the delay control signal DTC_CTRL, that is, representing a capability of each LSB of the DTC_GAIN in changing the magnitude of the adjustment gain $K_{DTC}[k]$.

In other words, in actual working, the DTC determines the adjustment gain of the delay control signal according to the foregoing formula (6), where the gain control signal DTC_GAIN is input to the DTC by the controller.

It should be noted that, as described above, the control on the working of the DTC by the controller may be embodied only in inputting the delay control signal DTC_CTRL to the DTC. In this case, it may be assumed that the adjustment gain $K_{DTC}[k]$ of the delay control signal DTC_CTRL is a constant, for example, 1. That is, the value of the gain control signal DTC_GAIN is 0 at this time. At this time, the specific value of the delay control signal DTC_CTRL may be determined according to the formula (5) in combination with the following formula (7).

$$|\Delta T_{DTC}[k] - \Delta T_{TDC}[k]| \leq \varepsilon \qquad (7)$$

where $\varepsilon$ is the preset threshold with a value greater than or equal to 0.

A meaning expressed by the formula (7) is that the time difference between the reference clock CLK_REF and the feedback clock CLK_DIV is almost equal to the time difference between the reference clock CLK_REF and the delayed reference clock CLK_DTC.

However, in order to implement accurate control, further, the gain control signal DTC_GAIN may also be input to the DTC on the basis of inputting the delay control signal DTC_CTRL to the DTC, that is, the value of the gain control signal DTC_GAIN is not 0.

In order to implement accurate control, the preset threshold is set to be $\varepsilon=0$. Then, $|\Delta T_{DTC}[k] - \Delta T_{TDC}[k]| = 0$. In this case, according to the formula (4), the delay caused by the DTC to the active edge of the reference clock CLK_REF is also $$\Delta T_{TDC}[k] = T_{DCO} \times \sum_{i=1}^{k} N_{QERR}[i].$$

With reference to the formula (5), it can be seen that the value $D_{DTC}[k]$ of the delay control signal DTC_CTRL is:

$$D_{DTC}[k] = \sum_{i=1}^{k} N_{QERR}[i]$$
$$= \sum_{i=1}^{k} (N_{DIV}[i] - N.F)$$

That is, the controller determines the value $D_{DTC}[k]$ of the delay control signal according to the following formula (1):

$$D_{DTC}[k] = \sum_{i=1}^{k} (N_{DIV}[i] - N.F) \qquad (1)$$

Correspondingly, in an ideal situation, the adjustment gain $K_{DTC}[k]$ of the delay control signal is:

$$K_{DTC}[k] = T_{DCO} \qquad (8)$$

The formula (7) is digital signal processing that can be implemented in the controller, that is, the controller is a digital logic circuit.

Figure 8:
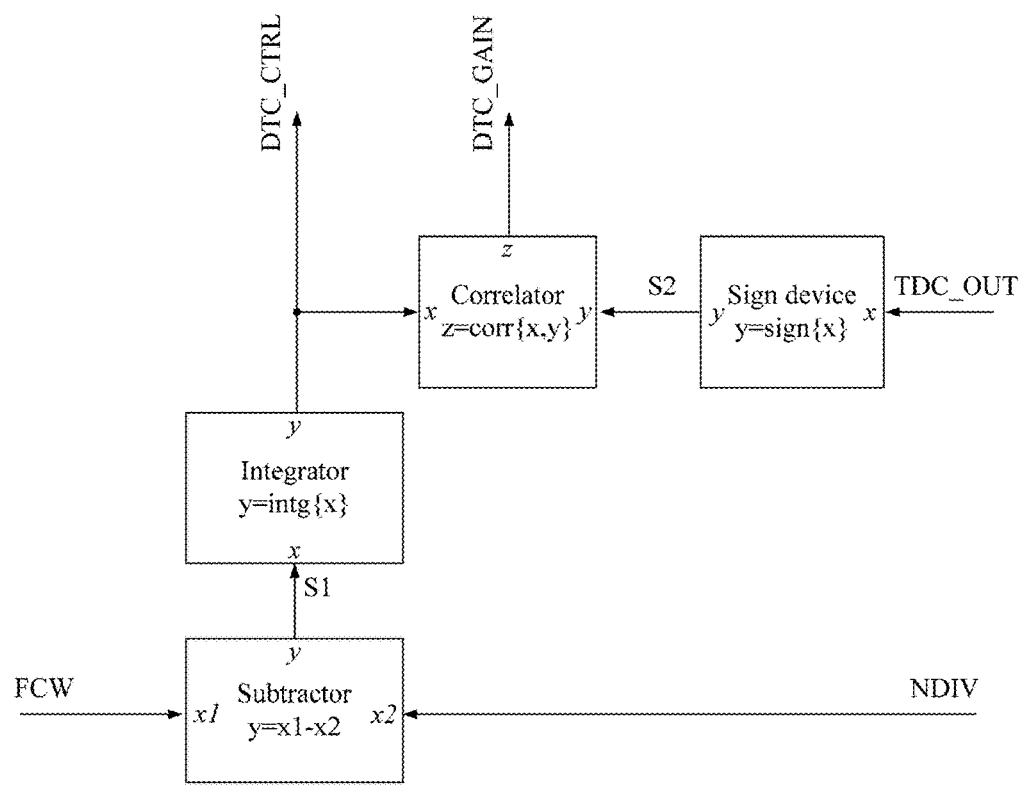
FIG. 8 is a schematic diagram of a compositional structure of a controller in an embodiment of the present invention.

Specifically, as shown in FIG. 8, the operation in the formula (7) may be completed by a subtractor and an integrator that are provided in the controller.

The adjustment gain in the formula (8) is an analog quantity which needs to be designed and implemented in the DTC.

According to the deduction of the foregoing mathematical model, it is found that the value of the delay control signal output to the DTC is determined according to the formula (1) for the frequency control word and the frequency division control word when the controller has a practical application. Therefore, based on the foregoing theoretical analysis, it is understood that the delayed reference clock obtained by performing the delay processing on the reference clock by the DTC under the effect of the delay control signal has almost the same phase as the feedback clock.

Although a theoretical value of the adjustment gain of the delay control signal has been obtained in the foregoing model deduction, the adjustment gain is controlled by the gain control signal output by the controller in the case of accurate control. The following mathematically deduces a process for determining the value of the gain control signal to determine a more preferred structure of the control apparatus added to the phase-locked loop, for example, a structure shown in FIG. 5.

Figure 5:
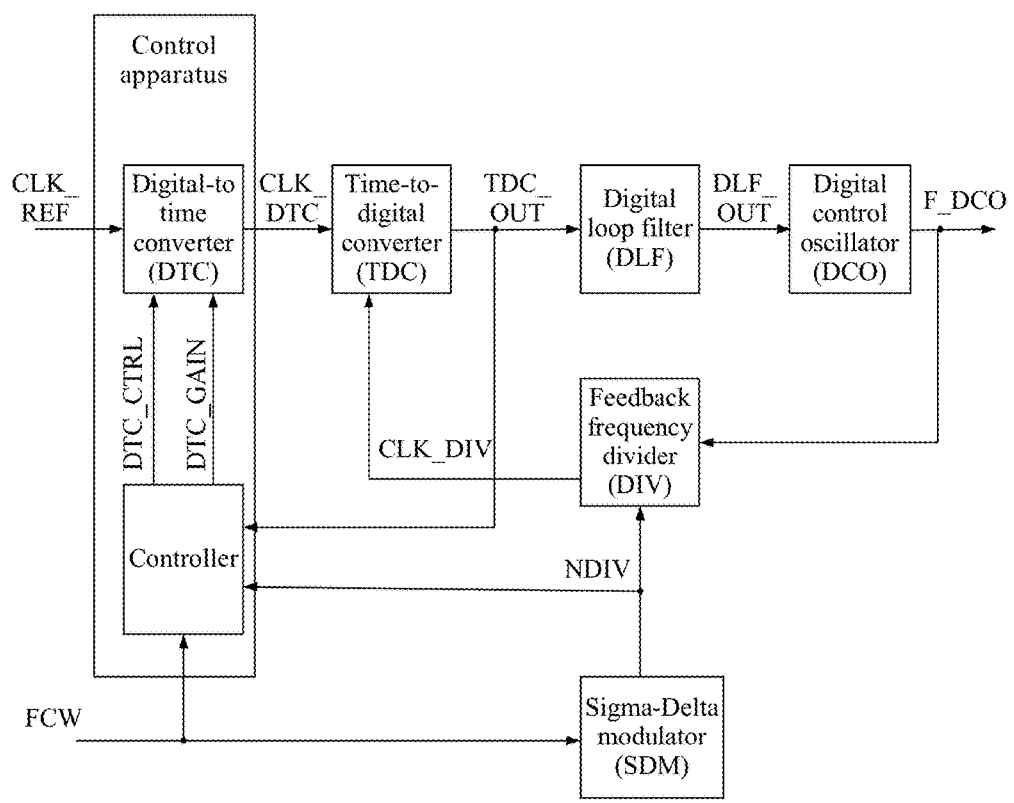
FIG. 5 is a schematic structural diagram of a digital fractional frequency-division phase-locked loop according to Embodiment 3 of the present invention.

First, the structure of the control apparatus shown in FIG. 5 and the working process of the controller are described. Then, a theoretical model on which the structure and the theoretical model depend is introduced.

As shown in FIG. 5, a third input end of the controller is connected to the output end of the TDC, and a second output end of the controller is connected to the second input end of the DTC for transferring the gain control signal DTC_GAIN to the DTC.

In this case, the controller is configured to determine the value of the gain control signal according to the frequency control word, the frequency division control word and the time difference that is output by the TDC, that is, the time difference between the delayed reference clock and the feedback clock.

Specifically, the controller determines, by using a preset adaptive correction algorithm, a value $G_{DTC}[k]$ of the gain control signal, according to the following formula (9):

$$G_{DTC}[k] = K_{LMS} \times \sum_{i=1}^{k} \{D_{DTC}[i] \times \text{sgn}(D_{TDC}[i])\} \quad (9)$$

where $G_{DTC}[k]$ is a value of the gain control signal at the $k^{th}$ sampling point, $K_{LMS}$ is a gain of the adaptive correction algorithm, $D_{DTC}[i]$ is a time difference that is output by the TDC at the $i^{th}$ sampling point, and sgn( ) is a sign function.

The following describes structures of the controller and the DTC, and a theoretical model on which their working process depends.

Specifically, it can be seen from the foregoing analysis that, for the adjustment gain of the delay control signal described in the formula (8), its generation method depends on design of an analog circuit. With respect to a digital control, precision control is harder. There are problems mainly in the following two aspects:

Firstly, as described in the formula (8), the magnitude of the adjustment gain of the delay control signal is required to be equal to a cycle of the output oscillation signal F_DCO in the locked state of the phase-locked loop. For the phase-locked loop applied to a communications system, it is generally required that the frequency of the output oscillation signal F_DCO can be adjusted at a given frequency step within a considerably wide frequency range. In other words, in practical application, the adjustment gain of the delay control signal needs to be controlled according to the output signal frequency specified by the phase-locked loop.

Secondly, the adjustment gain of the delay control signal needs to be designed and implemented in an analog circuit. Therefore, the magnitude of its value is affected by factors such as chip processing fluctuation and chip working environment, and it is difficult to keep it stay at a given value.

According to the aforementioned working principle of the digital fractional frequency-division phase-locked loop, it is known that the magnitude the adjusting gain of the delay control signal determines whether the DTC can add a delay of a desired value to the active edge of the reference clock CLK_REF. In addition, in the foregoing ideal situation, still because the adjustment gain $K_{DTC}[k]$ of the delay control signal determined according to the formula (8) is an analog quantity and cannot be easily controlled or implemented, the DTC can adjust $K_{DTC}[k]$ according to the foregoing formula (6), so that it can be made as close as possible to the ideal value in the formula (8) by using a simple and effective means.

$$K_{DTC}[k] = K0_{DTC} + G_{DTC}[k] \times R_{DTC\_GAIN} \quad (6)$$

where $K0_{DTC}$ is the corresponding adjustment gain of the delay control signal when the value of the gain control signal, $G_{DTC}[k]$, is 0; and $R_{DTC\_GAIN}$ is the control coefficient of the gain control signal to the adjustment gain. These two parameters are implemented by design of a DTC analog circuit.

For the value $G_{DTC}[k]$ of the gain control signal, the controller may obtain by employing the adaptive correction algorithm according to the formula (9):

$$G_{DTC}[k] = K_{LMS} \times \sum_{i=1}^{k} \{D_{DTC}[i] \times \text{sgn}(D_{TDC}[i])\} \quad (9)$$

where $K_{LMS}$ is the gain of the adaptive correction algorithm, used for controlling the precision and speed of the correction algorithm. $K_{LMS}$ is a constant value in a given system and does not change with an environment in which the system operates; $D_{TDC}[k]$ is a value of the output signal TDC_OUT of the TDC at the $k^{th}$ sampling point and is determined according to $D_{TDC}[k]=\text{INT}(\Delta T_{TDC}[k]/R_{TDC})$; $R_{TDC}$ is a resolution of the TDC; and INT( ) is a rounding function.

It can be seen from this that the formula (9) is a digital signal processing process that can be completed in the controller. As shown in FIG. 8, the operation of the sgn( ) sign function can be completed by a sign device provided in the controller. The multiplication and integral operations in the formula (9) can be completed by related devices provided in the controller.

To sum up, in order to complete the delay processing on the reference clock, the DTC only needs to contain processing logic of a few simple analog circuits, and most processing is a digital signal processing process that is all implemented in the controller. Therefore, digital signal processing ensures precision of the control.

With reference to the deduction processes of the foregoing two mathematical models, a connection relationship between the controller and the DTC that are working practically and other components in the phase-locked loop, and internal compositions and working processes of the controller and the DTC can be obtained. That is, the controller determines, according to the formulas (1) and (9) respectively, the values of the delay control signal DTC_CTRL and the gain control signal DTC_GAIN that are transferred to the DTC. Therefore, after receiving the two control signals, the DTC performs the computation processes in the formula (6) and the formula (5), obtains a delay amount applied to the reference clock, and performs delay processing on the active edge of the reference clock by using the delay amount.

In the foregoing embodiment, an input time range of the time-to-digital converter TDC can be effectively reduced by introducing the digital-to-time converter DTC and the controller in the digital fractional frequency-division phase-locked loop. In general, design difficulty of a DTC is much lower than that of a TDC, and power consumption and an area of the DTC can be almost ignored with respect to the TDC. Therefore, in this embodiment of the present invention, the design difficulty of the TDC is greatly reduced with a small cost. On the other hand, in current mainstream TDC design, operating power consumption of the TDC in the locked state is often directly proportional to the input range of the DTC. That is, a larger input time value indicates greater power consumption required for the TDC to complete a time-to-digital conversion. In this embodiment of the present invention, because the input time range of the TDC can be reduced to a very small range, the operating power consumption of the TDC in the locked state is greatly reduced. Furthermore, the digital-to-time converter DTC is used to align the reference clock and the feedback clock signal, the quantization noise introduced due to use of the Delta-Sigma modulator is eliminated after clock alignment, and therefore makes no noise contribution to the phase-locked loop system. This greatly improves the noise characteristic of the phase-locked loop.

Figure 9:
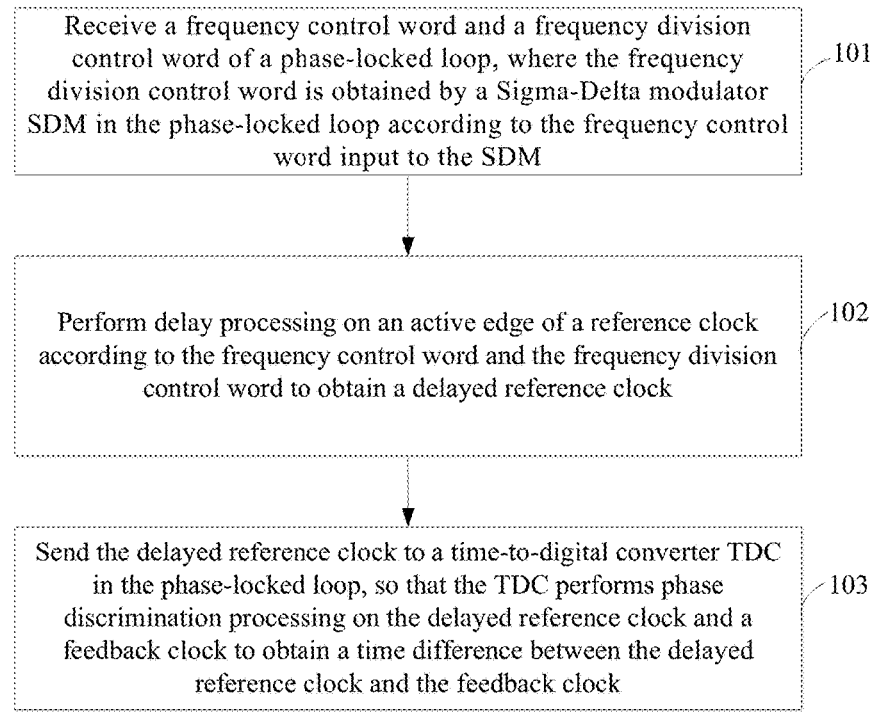
FIG. 9 is a flowchart of a method for controlling a digital fractional frequency-division phase-locked loop according to Embodiment 4 of the present invention.

FIG. 9 is a flowchart of a method for controlling a digital fractional frequency-division phase-locked loop according to Embodiment 4 of the present invention. As shown in FIG. 9, the method for controlling a digital fractional frequency-division phase-locked loop provided in this embodiment specifically includes the following steps.

Step 101. Receive a frequency control word and a frequency division control word of the phase-locked loop, where the frequency division control word is obtained by a Sigma-Delta modulator SDM in the phase-locked loop according to the frequency control word input to the SDM.

The method provided in this embodiment is executed by a control apparatus added to the digital fractional frequency-division phase-locked loop. Specifically, with reference to specific compositional structures of the control apparatus shown in FIG. 4 and FIG. 5, the control apparatus includes a controller and a DTC. The controller is connected to an input end and an output end of the SDM separately, so that the controller can obtain the frequency control word input to the SDM and the frequency division control word output by the SDM.

Step 102. Perform delay processing on an active edge of a reference clock according to the frequency control word and the frequency division control word to obtain a delayed reference clock.

Specifically, the controller first determines a value of a delay control signal transferred to the DTC according to the frequency control word and the frequency division control word, and then transmits the determined value of the delay control signal to the DTC, so that the DTC can perform delay processing, according to the value of the delay control signal, on the active edge, for example a rising edge, of the reference clock input to the DTC, to obtain the delayed reference clock.

The controller specifically determines a value $D_{DTC}[k]$ of the delay control signal, according to the following formula:

$$D_{DTC}[k] = \sum_{i=1}^{k} (N_{DIV}[i] - N.F)$$

where $D_{DTC}[k]$ is a value of the delay control signal at the $k^{th}$ sampling point, $N_{DIV}[i]$ is an instantaneous value of the frequency division control word output by the SDM at the $i^{th}$ sampling point, and N.F is a value of the frequency control word, where N is an integer part of the frequency control word, and .F denotes a fractional part of the frequency control word.

In another optional embodiment, based on the deduction process of the foregoing mathematical deduction model, in addition to inputting the delay control signal to the DTC, the control on the DTC by the controller may further be inputting a gain control signal to the DTC in order to implement more accurate delay control on the active edge of the reference clock, so as to control an adjustment gain of the delay control signal to the active edge of the reference clock. Accordingly, based on the foregoing model, when determining the value of the delay control signal input to the DTC according to the formula (1), the controller may also determine a value of the gain control signal according to the frequency control word, the frequency division control word, and the time output by the TDC, that is, the time difference between the clock and the feedback clock. Specifically, the controller determines, by using a preset adaptive correction algorithm, a value $G_{DTC}[k]$ of the gain control signal, according to the following formula:

$$G_{DTC}[k] = K_{LMS} \times \sum_{i=1}^{k} \{D_{DTC}[i] \times \text{sgn}(D_{TDC}[i])\}$$

where $G_{DTC}[k]$ is a value of the gain control signal at the $k^{th}$ sampling point, $K_{LMS}$ is a gain of the adaptive correction algorithm, $D_{TDC}[i]$ is a time difference that is output by the TDC at the $i^{th}$ sampling point, and sgn( ) is a sign function.

Therefore, after the controller determines and inputs to the DTC the values of the delay control signal and the gain control signal according to the foregoing two formulas, the DTC first obtains the adjustment gain of the delay control signal according to the following formula: $K_{DTC}[k]=K0_{DTC}+G_{DTC}[k]\times R_{DTC\_GAIN}$, where $K_{DTC}[k]$ is the adjustment gain of the delay control signal at the $k^{th}$ sampling point, $K0_{DTC}$ is a corresponding adjustment gain of the delay control signal when the value of the gain control signal, $G_{DTC}[k]$, is 0, and $R_{DTC\_GAIN}$ is a control coefficient of the gain control signal to the adjustment gain $K_{DTC}[k]$. Afterwards, the DTC determines, according to the following formula $\Delta T_{DTC}[k]=D_{DTC}[k]\times K_{DTC}[k]$, a delay amount acting on the active edge of the reference clock, that is, the delay of the delayed reference clock relative to the reference clock is $\Delta T_{DTC}[k]=D_{DTC}[k]\times K_{DTC}[k]$.

After determining the delay amount, the DTC performs the delay processing on the active edge of the reference clock to obtain the delayed reference clock.

Step 103. Send the delayed reference clock to a time-to-digital converter TDC in the phase-locked loop, so that the TDC performs phase discrimination processing on the delayed reference clock and a feedback clock to obtain a time difference between the delayed reference clock and the feedback clock.

The feedback clock is obtained by a feedback frequency divider DIV in the phase-locked loop according to the frequency division control word received from the SDM, by performing frequency division processing on a DCO output signal received from a digital controlled oscillator DCO. The DCO output signal is obtained by the DCO according to a filtering processing result, and the filtering processing result is obtained by a digital loop filter DLF by performing filtering processing on the time difference that is output after the TDC performs the phase discrimination processing.

Specifically, the DTC inputs the delayed reference clock obtained after the delay processing to the TDC. The TDC is a device for implementing phase discrimination, and performs phase discrimination on the input delayed reference clock and the feedback clock fed back from the DCO to the TDC.

In this embodiment, by adding a control apparatus including a controller and a DTC to a basic digital fractional frequency-division phase-locked loop, the controller can determine a delay control signal input to the DTC and a gain control signal for controlling an adjustment gain of the delay control signal based on a frequency control word, a frequency division control word, and a TDC output signal that are currently used by the phase-locked loop, so that the DTC obtains the adjustment gain of the delay control signal according to the gain control signal and then obtains, based on the adjustment gain and the delay control signal, a delay amount acting to an active edge of the reference clock, so as to perform delay processing on the active edge of the reference clock with the delay amount. This ensures that a time difference between the delayed reference clock and the feedback clock fed back by a DCO and a DIV is almost zero, thereby greatly reducing a time-domain input range of the TDC and lowering a requirement on a resolution of the TDC resolution, and also effectively suppressing in-band noise, making design difficulty of the phase-locked loop greatly reduced. A person of ordinary skill in the art may understand that all or some of the steps of the method embodiments may be implemented by a program instructing relevant hardware. The program may be stored in a computer readable storage medium. When the program runs, the steps of the method embodiments are performed. The foregoing storage medium includes: any medium that can store program code, such as a ROM, a RAM, a magnetic disk, or an optical disc.

Finally, it should be noted that the foregoing embodiments are merely intended for describing the technical solutions of the present invention, but not for limiting the present invention. Although the present invention is described in detail with reference to the foregoing embodiments, a person of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A digital fractional frequency-division phase-locked loop, comprising:
    a control apparatus;
    a time-to-digital converter (TDC);
    a digital loop filter (DLF);
    a digital controlled oscillator (DCO);
    a feedback frequency divider (DIV); and
    a Sigma-Delta modulator (SDM); wherein:
    an output end of the control apparatus is connected to a first input end of the TDC;
    an output end of the TDC is connected to an input end of the DLF;
    an output end of the DLF is connected to an input end of the DCO;
    an output end of the DCO is connected to a first input end of the DIV;
    an output end of the DIV is connected to a second input end of the TDC;
    a second input end of the DIV is connected to an output end of the SDM;
    a first input end of the control apparatus is connected to the output end of the SDM;
    a second input end of the control apparatus is connected to an input end of the SDM; and
    a third input end of the control apparatus receives a reference clock of the phase-locked loop;
    the SDM is configured to obtain a frequency division control word according to a frequency control word input to the SDM;
    the DIV is configured to perform frequency division processing on an output signal of the DCO according to the frequency division control word to obtain a feedback clock;
    the control apparatus is configured to perform delay processing on an active edge of the reference clock according to the frequency control word and the frequency division control word to obtain a delayed reference clock;
    the TDC is configured to perform phase discrimination processing on the feedback clock and the delayed reference clock to obtain a time difference between the delayed reference clock and the feedback clock;
    the DLF is configured to perform filtering processing on the time difference that is output after the TDC performs the phase discrimination processing to obtain a processing result; and
    the DCO is configured to obtain the output signal according to the processing result.

2. The phase-locked loop according to claim 1, wherein the control apparatus comprises:
    a controller; and
    a digital-to-time converter (DTC);
    a first input end of the controller is connected to the first input end of the control apparatus, and a second input end of the controller is connected to the second input end of the control apparatus;
    a first output end of the controller is connected to a first input end of the DTC;
    a second input end of the DTC is connected to a third input end of the control apparatus;
    an output end of the DTC is connected to the output end of the control apparatus;
    the controller is configured to receive the frequency control word and the frequency division control word, and determine a value of a delay control signal according to the frequency control word and the frequency division control word; and
    the DTC is configured to perform the delay processing on the active edge of the reference clock according to the value of the delay control signal to obtain the delayed reference clock.

3. The phase-locked loop according to claim 2, wherein the controller is a digital logic circuit.

4. The phase-locked loop according to claim 2, wherein the controller is configured to determine a value $D_{DTC}[k]$ of the delay control signal, according to the following formula:

$$D_{DTC}[k] = \sum_{i=1}^{k} (N_{DIV}[i] - N.F)$$

wherein $D_{DTC}[k]$ is a value of the delay control signal at the $k^{th}$ sampling point, $N_{DIV}[i]$ is an instantaneous value of the frequency division control word output by the SDM at the $i^{th}$ sampling point, and N.F is a value of the frequency control word, wherein N is an integer part of the frequency control word, and .F denotes a fractional part of the frequency control word.

5. The phase-locked loop according to claim 2, wherein a third input end of the controller is connected to the output end of the TDC and the second input end of the controller is connected to the second input end of the DTC; and
    the controller is further configured to determine a value of a gain control signal according to the frequency control word, the frequency division control word, and the time difference that is output by the TDC, wherein the gain control signal is used to control an adjustment gain of the delay control signal.

6. The phase-locked loop according to claim 5, wherein the controller is configured to, by using a preset adaptive correction algorithm, determine a value $G_{DTC}[k]$ the gain control signal, according to the following formula:

$$G_{DTC}[k] = K_{LMS} \times \sum_{i=1}^{k} \{D_{DTC}[i] \times \text{sgn}(D_{TDC}[i])\}$$

wherein $G_{DTC}[k]$ is a value of the gain control signal at the $k^{th}$ sampling point, $K_{LMS}$ is a gain of the adaptive correction algorithm, $D_{TDC}[i]$ is a time difference that is output by the TDC at the $i^{th}$ sampling point, and sgn( ) is a sign function.

7. The phase-locked loop according to claim 5, wherein a delay of the delayed reference clock relative to the reference clock is $\Delta T_{DTC}[k]=D_{DTC}[k] \times K_{DTC}[k]$, wherein $K_{DTC}[k]$ is an adjustment gain of the delay control signal at the $k^{th}$ sampling point.

8. The phase-locked loop according to claim 7, wherein the DTC is configured to obtain the adjustment gain according to the following formula: $K_{DTC}[k]=K0_{DTC}+G_{DTC}[k] \times R_{DTC\_GAIN}$, wherein $K0_{DTC}$ is a corresponding adjustment gain of the delay control signal when the value of the gain control signal, $G_{DTC}[k]$, is 0; and $R_{DTC\_GAIN}$ is a control coefficient of the gain control signal to the adjustment gain $K_{DTC}[k]$.

9. A method for controlling a digital fractional frequency-division phase-locked loop, the method comprising:
receiving a frequency control word and a frequency division control word of the phase-locked loop, wherein the frequency division control word is obtained by a Sigma-Delta modulator (SDM) in the phase-locked loop according to the frequency control word input to the SDM;
performing delay processing on an active edge of a reference clock according to the frequency control word and the frequency division control word to obtain a delayed reference clock; and
sending the delayed reference clock to a time-to-digital converter (TDC) in the phase-locked loop, so that the TDC performs phase discrimination processing on the delayed reference clock and a feedback clock to obtain a time difference between the delayed reference clock and the feedback clock;
wherein the feedback clock is obtained by a feedback frequency divider (DIV) in the phase-locked loop according to the frequency division control word received from the SDM by performing frequency division processing on a digital controlled oscillator (DCO) output signal received from a DCO, the DCO output signal is obtained by the DCO according to a filtering processing result, and the filtering processing result is obtained by a digital loop filter (DLF) by performing filtering processing on the time difference that is output after the TDC performs the phase discrimination processing.

10. The phase-locked loop according to claim 9, wherein performing delay processing on an active edge of a reference clock according to the frequency control word and the frequency division control word to obtain a delayed reference clock comprises:
determining a value of a delay control signal according to the frequency control word and the frequency division control word; and performing the delay processing on the active edge of the reference clock according to the value of the delay control signal to obtain the delayed reference clock.

11. The method according to claim 10, wherein determining a value of a delay control signal according to the frequency control word and the frequency division control word comprises:
determining a value $D_{DTC}[k]$ of the delay control signal, according to the following formula:

$$D_{DTC}[k] = \sum_{i=1}^{k} (N_{DIV}[i] - N.F)$$

wherein $D_{DTC}[k]$ is a value of the delay control signal at the $k^{th}$ sampling point, $N_{DIV}[i]$ is an instantaneous value of the frequency division control word output by the SDM at the $i^{th}$ sampling point, and N.F is a value of the frequency control word, wherein N is an integer part of the frequency control word, and .F denotes a fractional part of the frequency control word.

12. The method according to claim 9, further comprising:
determining a value of a gain control signal according to the frequency control word, the frequency division control word, and the time difference that is output by the TDC, wherein the gain control signal is used to control an adjustment gain of the delay control signal.

13. The method according to claim 12, wherein determining a value of a gain control signal according to the frequency control word, the frequency division control word, and the time difference that is output by the TDC comprises:
determining, by using a preset adaptive correction algorithm, a value $G_{DTC}[k]$ of the gain control signal, according to the following formula:

$$G_{DTC}[k] = K_{LMS} \times \sum_{i=1}^{k} \{D_{DTC}[i] \times \text{sgn}(D_{TDC}[i])\}$$

wherein $G_{DTC}[k]$ is a value of the gain control signal at the $k^{th}$ sampling point, $K_{LMS}$ is a gain of the adaptive correction algorithm, $D_{TDC}[i]$ is a time difference that is output by the TDC at the $i^{th}$ sampling point, and sgn( ) is a sign function.

14. The method according to claim 12, wherein a delay of the delayed reference clock relative to the reference clock is $\Delta T_{DTC}[k]=D_{DTC}[k] \times K_{DTC}[k]$, wherein $K_{DTC}[k]$ is an adjustment gain of the delay control signal at the $k^{th}$ sampling point.

15. The method according to claim 14, further comprising:
obtaining the adjustment gain according to the following formula: $K_{DTC}[k]=K0_{DTC}+G_{DTC}[k] \times R_{DTC\_GAIN}$, wherein $K0_{DTC}$ is a corresponding adjustment gain of the delay control signal when the value of the gain control signal, $G_{DTC}[k]$, is 0; and $R_{DTC\_GAIN}$ is a control coefficient of the gain control signal to the adjustment gain $K_{DTC}[k]$.

* * * * *